United States Patent [19]

Lawson

[11] Patent Number: 5,106,138
[45] Date of Patent: Apr. 21, 1992

[54] LINEAR TWEEZERS

[75] Inventor: Robert M. Lawson, Santa Clara, Calif.

[73] Assignee: Hewlett-Packard Company, Palo Alto, Calif.

[21] Appl. No.: 631,204

[22] Filed: Nov. 21, 1990

Related U.S. Application Data

[63] Continuation of Ser. No. 361,536, Jun. 5, 1989, abandoned.

[51] Int. Cl.$^5$ .................... B66C 1/02; H05K 3/30
[52] U.S. Cl. .................... 294/2; 294/119.1; 29/743
[58] Field of Search .......... 294/119.1, 86.4, 2; 29/743, 739, 740; 901/31, 32, 36, 39; 269/108, 216, 218

[56] References Cited

U.S. PATENT DOCUMENTS

| | | | |
|---|---|---|---|
| 3,586,176 | 6/1971 | Rackman et al. | 214/6 |
| 4,518,187 | 5/1985 | Blatt et al. | 294/88 |
| 4,599,037 | 7/1986 | Ross, Jr. et al. | 294/2 X |
| 4,611,846 | 9/1986 | Feiber et al. | 294/88 |
| 4,736,971 | 4/1988 | McManus | 294/119.1 X |
| 4,753,004 | 6/1988 | Fujioka | 29/743 X |
| 4,762,357 | 8/1988 | Bergamo | 294/119.1 |
| 4,768,821 | 9/1988 | Hucul et al. | 294/119.1 |
| 4,802,816 | 2/1989 | Mezhinsky | 414/736 |

FOREIGN PATENT DOCUMENTS

| | | | |
|---|---|---|---|
| 22331 | 1/1981 | European Pat. Off. | 294/119.1 |
| 0060896 | 9/1981 | European Pat. Off. | |
| 312041 | 12/1988 | Japan | 294/119.1 |
| 606949 | 11/1978 | Switzerland | 294/119.1 |
| 2124180 | 7/1982 | United Kingdom . | |
| 2137160 | 10/1984 | United Kingdom | 294/119.1 |
| 2185458 | 11/1986 | United Kingdom . | |

OTHER PUBLICATIONS

IBM Technical Disclosure Bulletin, vol. 28, No. 1, Jun. 1985, "Workpiece Gripper".

Primary Examiner—Margaret A. Focarino
Assistant Examiner—Dean J. Kramer

[57] ABSTRACT

A linear tweezers for automatically placing a component on a printed circuit board. Two pairs of mutually orthogonal, oppositely-directed, linearly-actuated tweezer legs center a component along perpendicular transverse axes with respect to a projecting axis. Each opposing pair of legs is connected by a flexible inelastic drive belt, assuring that the legs approach the projecting axis at the same rate. The component is located between the legs and is precisely centered by the legs as they approach the projecting axis. The component is then gripped by both pairs of legs and transported to a desired location. A vacuum gripping chuck grasps the component and moves along the projecting axis away from the tweezer legs to place the component without disturbing any nearby unsecured parts.

8 Claims, 6 Drawing Sheets

LINEAR TWEEZERS

This is a continuation of copending application Ser. No. 07/361,536 filed on Jun. 5, 1989, now abandoned.

BACKGROUND OF THE INVENTION

The present invention relates generally to gripping tools and more particularly to a power-driven tweezers adapted for use on an automatic assembly machine for picking up a part and placing the part in a desired location on a device being assembled by the machine.

Automatic assembly machines are widely used in industry to assemble various kinds of products. One of the operations commonly performed by such machines is picking up a part and placing it in a desired location on a subassembly. A power-driven gripping tool carried by a movable arm or the like is used to pick up the part and place it in the desired spot. For example, a machine which assembles printed circuit boards uses a tweezers-like gripping tool to pick up an electronic component such as an integrated circuit chip from a parts bin and place the component on a printed circuit board.

A gripping tool which picks up an electronic component must be gentle enough not to damage the component. At the same time the tool must be able to grasp the component securely enough to carry it to the desired location on the circuit board, to orient it with respect to the wiring on the board, and to place it on the board without disturbing other nearby components which have not yet been soldered into place.

Figure 1A:
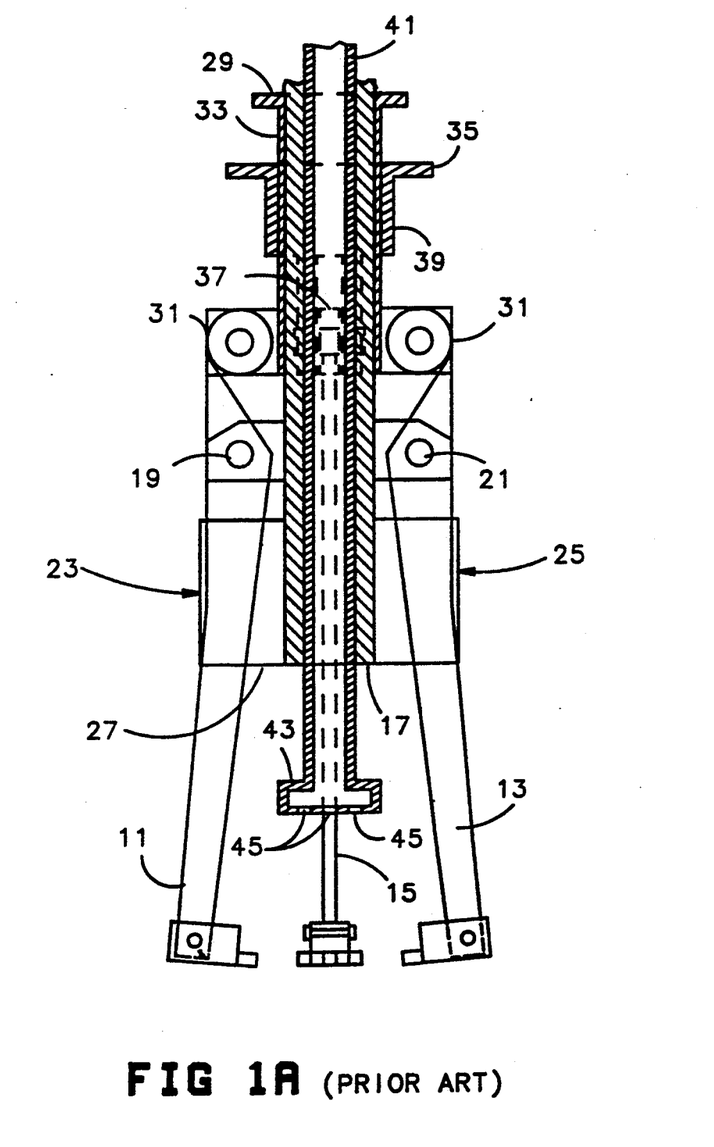
FIG. 1A is a sectional view of a gripping tool according to the prior art.
Figure 1B:
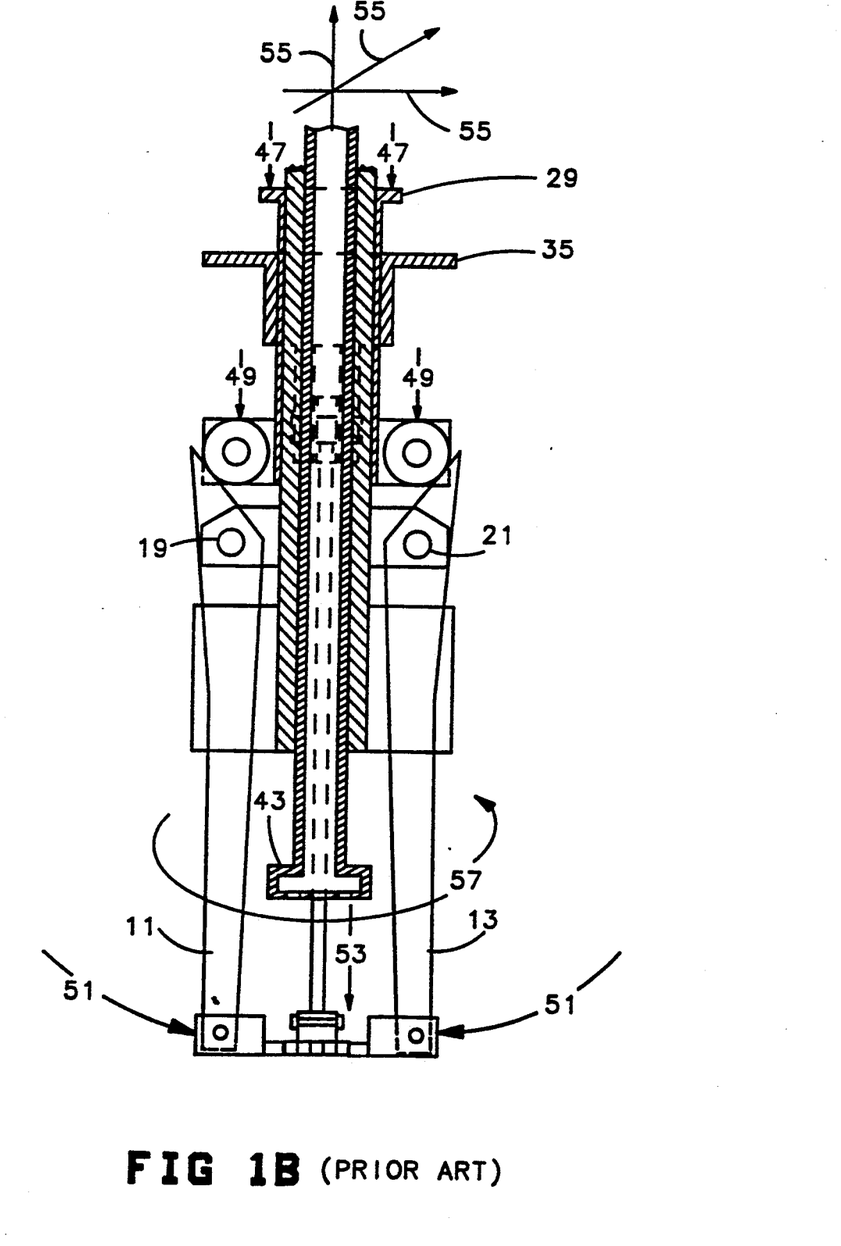
FIG. 1B is a view of the tool shown in FIG. 1A with the tweezer legs in gripping position.

An example of the kinds of gripping tools which have been used to pick up electronic components and locate them on circuit boards is shown in FIGS. 1A and 1B. Oppositely-directed tweezer legs 11 and 13 and a tweezer leg 15 orthogonal to the legs 11 and 13 are carried by a shaft 17 (a fourth leg opposite the leg 15 is not shown). The legs 11 and 13 pivot about pins 19 and 21, respectively, through slots 23 and 25 defined in a casing 27 carried by the shaft 17. An upper extremity of the shaft 17 is attached to an assembly machine (not shown). A collar 29 and a pair of rollers 31 are carried by a tubular shaft 33 which slides up and down over the shaft 17, and another collar 35 and a pair of rollers 37 (one of which is not shown) are carried by a tubular shaft 39 which slides up and down over the shaft 33. Springs (not shown) urge the legs into a spread-apart configuration as depicted in FIG. 1A. A vacuum conduit 41 which slides up and down within the shaft 17 carries a chuck 43 having a plurality of small holes 45 in its lower surface.

To pick up a component, a downward force is exerted on the collar 29 as indicated by arrows 47, pressing the rollers 31 against upper extremities of the tweezer legs 11 and 13 as indicated by arrows 49 and urging the legs to pivot about their pivot points 19 and 21 whereby the lower extremities of the legs 11 and 13 converge on the component as indicated by arrows 51, tending to center the component between the legs 11 and 13. Then a downward force is exerted on the collar 35, causing the lower extremities of the other pair of legs to converge on the component and center it between those legs.

Next the chuck 43 is lowered into contact with the component as indicated by an arrow 53. A vacuum source (not shown) connected to an upper extremity of the conduit 41 generates a partial vacuum which acts through the openings 45 in the chuck 43 to hold the component. Then the tool is moved vertically and laterally as indicated by arrows 55 to carry the component to the desired location and then is rotated as indicated by an arrow 57 to correctly orient the component for placement. Finally the chuck 43 is lowered below the extremities of the tweezer legs to place the component on the circuit board without disturbing any nearby components.

Some components are not easily gripped by arcuately-moving gripping elements because the surfaces of such elements do not remain parallel as they converge. Gripping tools in which pivotal motions of levers are mechanically translated into parallel motions of gripping surfaces have been proposed; typical examples of such tools are models 7960, 8660 and 8460 parallel grippers made by PHD, Inc., Ft. Wayne, Ind., as described in PHD Technical Bulletin 922A.

As electronic components have become smaller and the density of these components on circuit boards has increased, the allowable margin for error in locating and orienting such parts on printed circuit boards has become very small. Contemporary surface mount integrated circuit chips are so tiny and have so many connection points that a placement error as little as a few thousandths of an inch can result in wrong connections and ultimate failure and rejection of the entire circuit board. Tools of the kinds described above for placing components on circuit boards have not been adequate in light of the extremely high placement accuracy which is now required, and there is a need for a tool which can grip a component such as a surface mount chip and place it in its designated location on a circuit board with sufficient accuracy to ensure correct interconnection with the wiring on a printed circuit board and without disturbing nearby unsecured components.

SUMMARY OF THE INVENTION

The present invention provides a linear tweezers which grips a component by means of positively-linked linearly-activated tweezer legs and accurately places the component in a desired location on a subassembly without disturbing any nearby components.

A linear tweezers according to the invention includes a supporting base, a pair of tweezer legs with gripper extremities, a guide which constrains any movement of the gripper extremities to linear movement along a transverse axis, a linearly-acting linkage connecting the legs, and an actuator which causes the gripper extremities to move toward each other to center and grip a component or other workpiece located between them.

The linkage, which preferably comprises an inelastic flexible belt such as a timing belt, responds to any movement of either gripper extremity along the transverse axis to cause the other gripper extremity to move an equal distance in the opposite direction along the axis.

The actuating means, for example a pneumatic cylinder, causes one gripper extremity to move toward the other and thereby, through the linkage, simultaneously urges the gripper extremities against opposite surfaces of the workpiece. This centers the workpiece along the transverse axis on a projecting axis which extends from the base perpendicular to the transverse axis.

Preferably, the linear tweezers includes a second pair of tweezer legs similar to the first and oriented orthogonally thereto. This second pair is operable independently of the first to center the workpiece along a second transverse axis and together with the first to grip the workpiece simultaneously on four sides.

The various components are preferably spaced apart from the projecting axis to allow room for a chuck which can be moved along the projecting axis to hold the workpiece after the workpiece has been centered. The chuck, which may hold the workpiece by vacuum pressure, carries the workpiece along the projecting axis to place it on the desired spot without disturbing any nearby unsecure components.

The gripper extremities preferably include means such as threaded holes for mounting various gripper tools each of which is complemental to a differently-shaped workpiece.

In a preferred embodiment, each tweezer leg is shaped like a horizontal letter U with transverse gripper and guide segments corresponding with the legs of the U and a support segment connecting the transverse segments. The open end of the gripper segment serves as the gripper extremity. The guide means defines a channel which receives the guide segments of a pair of these legs and confines any movement of the legs to linear movement through the channel. Each pair of legs is linked together by an inelastic, flexible drive belt looped around a pair of pulleys to define an endless loop having proximal and distal portions, one of the legs being connected to the proximal portion and the other leg to the distal portion.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

As shown in FIGS. 2 through 4 and 4A through 4D for purposes of illustration, the invention is embodied in a novel linear tweezers having oppositely-directed pairs of linearly-activated tweezer legs for gripping a component or other workpiece.

An automated assembly machine uses a gripping tool to pick up a workpiece such as an electronic component from a parts bin or the like and place the component in a desired location on a subassembly such as a printed circuit board. The trend toward smaller and smaller components such as surface mount integrated circuits having large numbers of connecting leads has led to a need for a gripping tool which can pick up such components without damaging them and position them within a margin for error that is measured in thousandths of an inch without disturbing any nearby components. Existing gripping tools, which typically have gripping elements that describe arcuate paths as they converge or that are moved by pivoting levers or the like, have not been adequate.

In accordance with the invention, a linear tweezers having linearly-activated tweezer legs grips a workpiece and positions it in a desired location with the required accuracy and without disturbing any nearby components. The linear tweezers facilitates automated assembly of printed circuit boards at high speed with a minimum of defects and can readily be reconfigured to accommodate workpieces having various shapes as desired.

Figure 2:
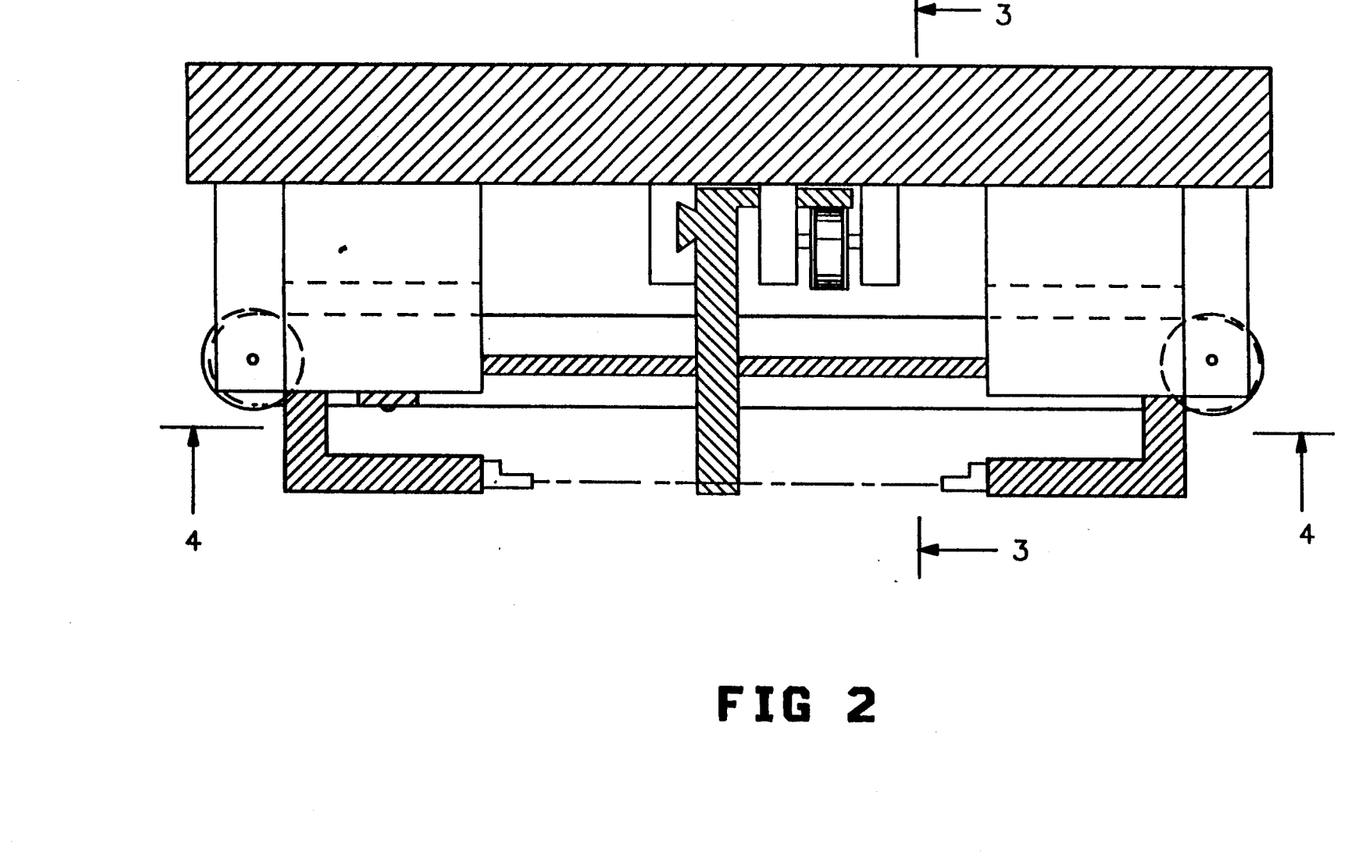
FIG. 2 is a side view of a linear tweezers according to the present invention.
Figure 3:
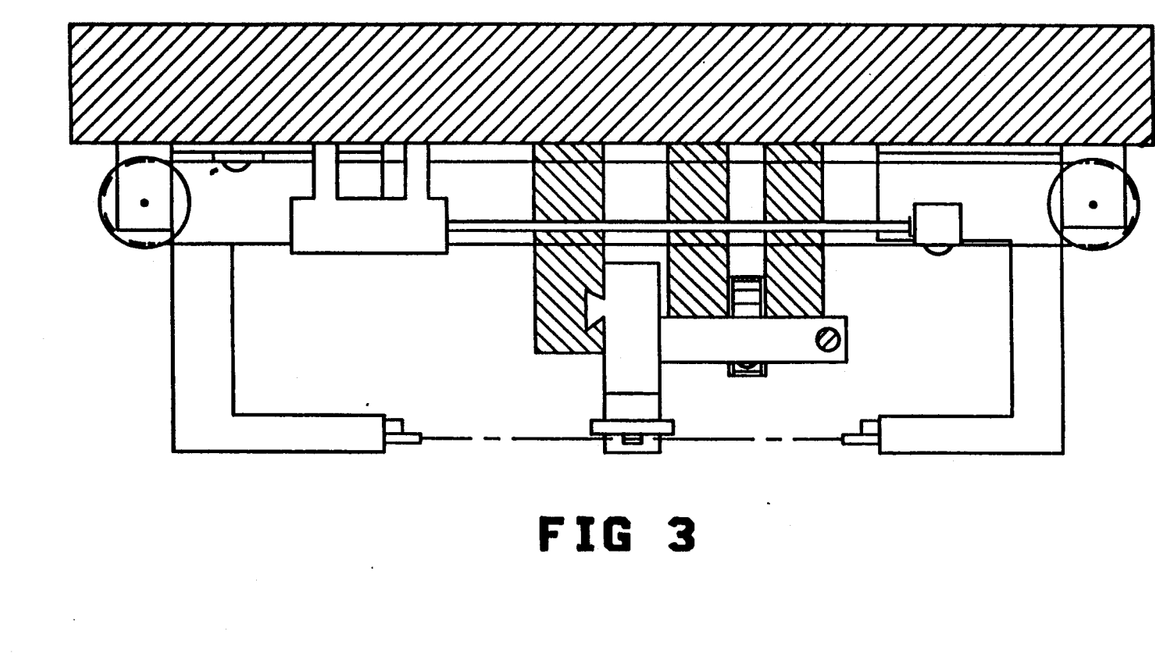
FIG. 3 is a side section view taken along the line 3—3 of FIG. 2.
Figure 4:
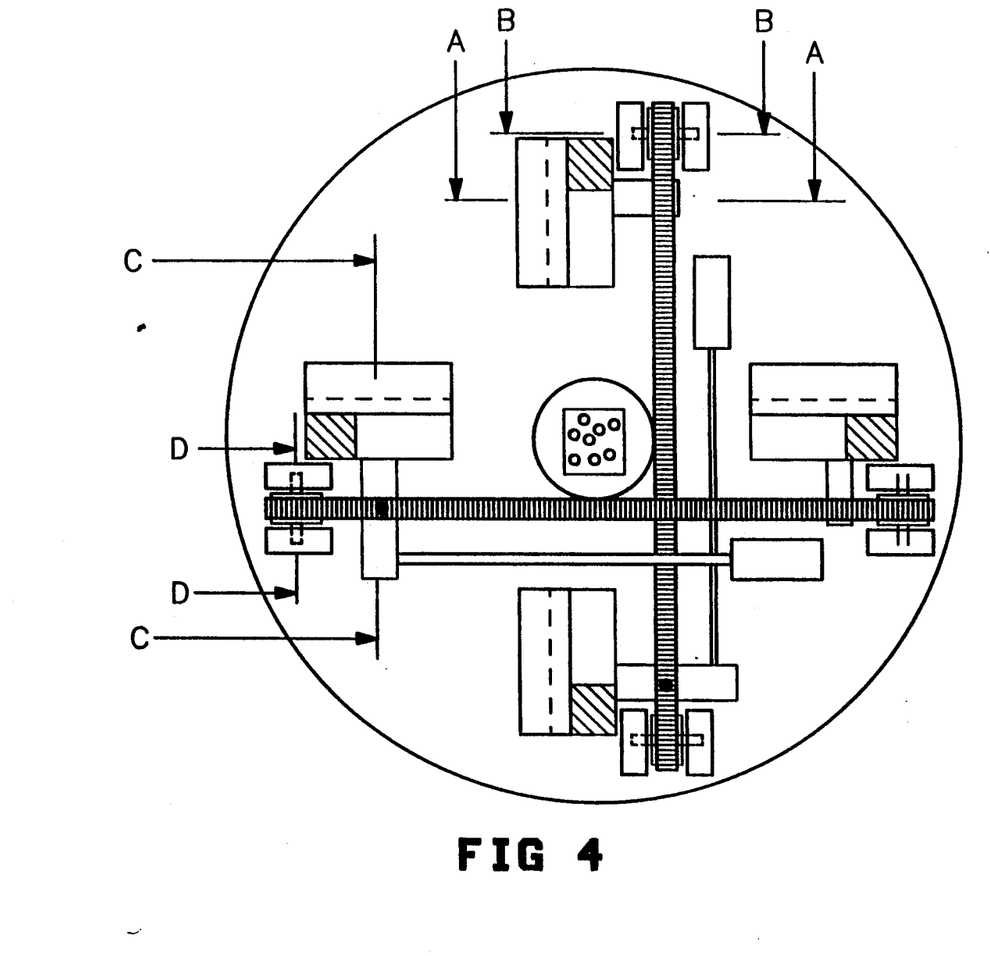
FIG. 4 is a bottom section view, taken looking up at the linear tweezers along the line 4—4 of FIG. 2.

As shown in FIGS. 2 through 4, a linear tweezers according to the invention comprises a base 61, a first pair of tweezer legs 63 and 65 carried by the base 61, first guide means such as supporting blocks 67 and 69, a linearly-acting linkage such as an inelastic flexible belt 71 connecting the legs 63 and 65, and first actuating means such as a pneumatic actuator 73 carried by the base 61.

Each of the legs 63 and 65 has a gripper extremity generally designated 75 and 77, respectively, for engaging opposite sides of a workpiece to be gripped (the workpiece is not shown in the drawings). Each gripper extremity preferably comprises a gripper tool such as the tools 79 and 81 carried by the legs 63 and 65, respectively, having a shape complemental to the shape of the workpiece. Means such as a threaded hole 83 in the leg 63 are provided for connecting the gripper tool to the leg.

The guide means constrains any movement of the gripper extremities to linear movement along a first transverse axis 85. In the embodiment shown, the guide means includes the support blocks 67 and 69 which are affixed to the base 61 and which define a channel consisting of channel portions 87 and 89 in the blocks 67 and 69, respectively, the channel portions being parallel with the axis 85; and complementary rails 91 and 93 carried by the legs 63 and 65, respectively. The rails 91 and 93 are slidable back and forth in the channel portions 87 and 89 parallel with the axis 85.

The drive belt 71 is responsive to any movement of either gripper extremity 75 or 77 through a distance in either direction along the axis 85 to cause the other gripper extremity to move an equal distance in the opposite direction.

The actuator 73 is operative to cause one gripper extremity 75 to move toward the other and thereby to urge the gripper extremities 75 and 77 against opposite surfaces of the workpiece located therebetween to center the workpiece along the transverse axis 85 on a projecting axis 95 which extends from the base perpendicular to the transverse axis 85 and to grip the workpiece.

Preferably the linear tweezers includes a second pair of tweezers legs 97 and 99 oriented generally orthogonally to the first pair of legs 63 and 65. The legs 97 and 99 have gripper extremities generally designated 101 and 103, respectively. The extremities 101 and 103 are shown carrying gripping tools 105 and 107, respectively, similar to the tools 79 and 81. Second guide means such as supporting blocks 109 and 111 defining a channel consisting of channel portions 110 and 112, respectively, constrain any movement of the gripper extremities 101 and 103 to linear movement along a second transverse axis 113 generally perpendicular to the first axis 85 and to the projecting axis 95. A second linearly-acting linkage such as a belt 115 similar to the belt 71 connects the legs 97 and 99. Second actuating means such as a pneumatic actuator 117 similar to the actuator 73 causes one of the gripper extremities 101 or 103 to move toward the other and thereby urges the gripper extremities against opposite surfaces of the workpiece to center the workpiece along the second transverse axis 113 on the projecting axis 95 and to grip the workpiece.

The first and second actuators 73 and 117 are preferably operable sequentially to center the workpiece along first one and then the other of the transverse axes 85 and 113 and simultaneously to grip the workpiece on four sides.

The legs, the guide means, the linkages and the actuating means are preferably spaced apart from the projecting axis 95 to allow space for a chuck 119 to move along the projecting axis 95 to grasp or hold the workpiece after the workpiece has been centered and to carry the workpiece along the axis 95. The base 61 includes means such as an opening 121 for receiving the chuck 119. The chuck 119 preferably includes a plurality of openings such as an opening 123 through which a vacuum provided by a vacuum source (not shown) in fluid communication with the chuck can be utilized to hold the workpiece tightly against the chuck.

Figure 4A:
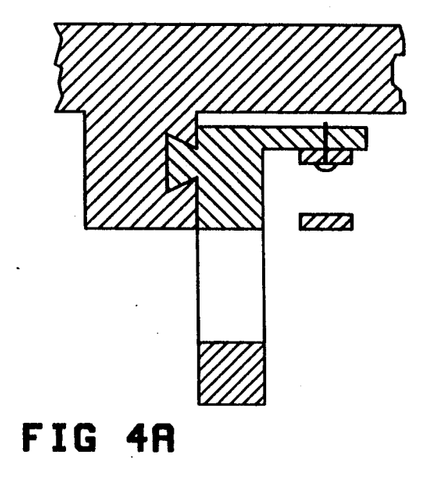
FIG. 4A is a detail section view taken along the line A—A of FIG. 4 showing a tweezer leg, the connection between the leg and the drive belt, and the guide channel which constrains the motion of the leg.
Figure 4B:
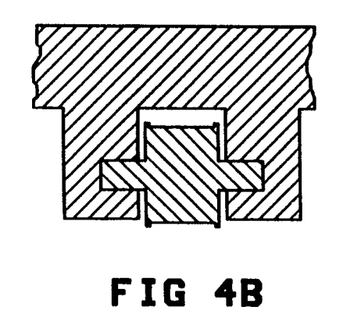
FIG. 4B is a detail section view taken along the line B—B of FIG. 4 showing a pulley.
Figure 4C:
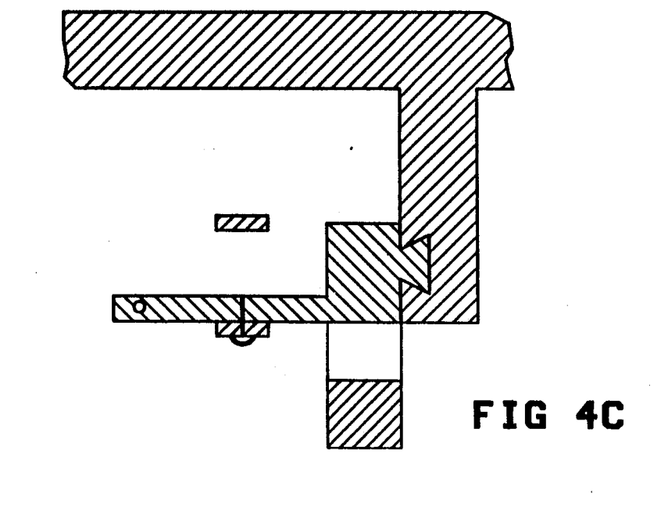
FIG. 4C is a detail section view taken along the line C—C of FIG. 4 showing a tweezer leg, the guide channel which constrains the motion of the leg, the connection between the leg and the drive belt, and the connection between the leg and the actuator, and further showing the leg in spaced-apart relation to the base.

In the embodiment shown, each of the tweezer legs is shaped generally like a horizontal letter U. For example, the leg 65 includes a transverse gripper segment 125 which carries the gripper tool 81, a transverse guide segment 127 which includes the rail 89, and a support segment 129 therebetween. Similarly, the leg 63 has a gripper segment 131, a guide segment 133, and a support segment 135 therebetween. The U-shaped legs 63 and 65 are disposed with their open ends facing each other such that when the legs are moved toward one another the gripper extremities 75 and 77 approach along the first transverse axis 85.

Figure 4D:
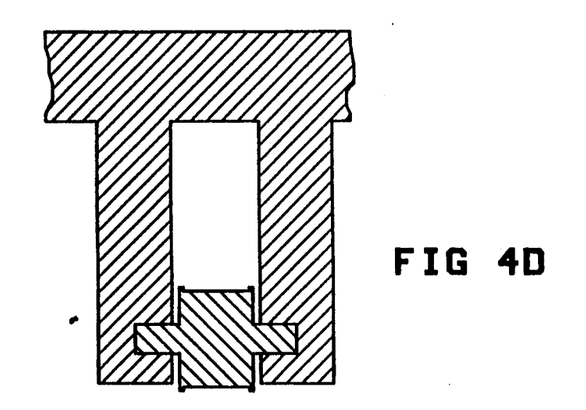
FIG. 4D is a detail section view taken along the line D—D of FIG. 4 showing a pulley in spaced-apart relation to the base.

The drive belt 71 is looped around a first pair of pulleys 137 and 139 carried by the base 61. The pulley 137 is supported by a shaft 141 which extends into support blocks 143 and 145 affixed to the base. Similarly the pulley 139 is supported by a shaft 147 which extends into support blocks 149 and 151. The belt 71 is looped around the pulleys 137 and 139 to define a first endless loop having proximal and distal portions 153 and 155 generally parallel to the channel portions 87 and 89.

Means such as an extension 157 of the guide segment 127 connects the legs 65 to the proximal portion 153 of the loop and an extension 159 of the guide segment 133 connects the other leg 63 to the distal portion 155 of the loop, for example through a rivet 160 or the like, whereby any movement of either leg 63 or 65 through a distance in either direction through the channel portions 87 and 89 is transmitted through the drive belt 71 to the other leg, causing the other leg to move an equal distance in the opposite direction.

The pneumatic actuator 73 is connected to the extension 159 of the leg 65 through a rod 161.

Similarly, the leg 97 includes a transverse gripper segment 163 which carries the gripper tool 105, a transverse guide segment 165 which includes a rail 166, and a support segment 167 therebetween. The leg 99 has a gripper segment 169, a guide segment 171 (the segment 171 includes a rail which for reasons of clarity is not shown) and a support segment 173 therebetween. The U-shaped legs 97 and 99 are disposed with their open ends facing each other such that when the legs are moved toward one another the gripper extremities 101 and 103 approach along the second transverse axis 113.

The drive belt 115 is looped around a second pair of pulleys 173 and 175 carried by the base 61. The pulley 173 is supported by a shaft 177 which extends into support blocks 179 and 181 affixed to the base. Similarly the pulley 175 is supported by a shaft 183 which extends into support blocks 185 and 187. The belt 115 is looped around the pulleys 173 and 175 to define a second endless loop having proximal and distal portions 189 and 191 generally parallel to the channel portions 110 and 112.

Means such as an extension 193 of the guide segment 165 connects the leg 97 to the proximal portion 189 of the loop, for example through a rivet 194 or the like, and an extension 195 of the guide segment 171 connects the other leg 99 to the distal portion 191 of the loop, for example through a rivet 196 or the like, whereby any movement of either leg through a distance in either direction through the channel portions 110 and 112 is transmitted through the drive belt 115 to the other leg, causing the other leg to move an equal distance in the opposite direction.

The pneumatic actuator 117 is connected to the extension 195 of the leg 99 through a rod 197.

The belts 71 and 115 are preferably fabricated of Kevlar; an example of such a belt is a model 6B16-100-012 from Stock Drive Products of New Hyde Park, N.Y.

The second pair of legs 97 and 99 are preferably spaced nearer the base 61 than the first pair of legs 63 and 65 such that all four of the legs 63, 65, 97 and 99 can closely approach the projecting axis 95 to grip a small component without colliding with each other. Similarly, the drive belt 115 and its associated pulleys and actuator are spaced closer to the base 61 than the drive belt 71 and its associated parts.

In operation, the linear tweezers is carried by a movable arm or the like (not shown) of an automatic assembly machine, for example by a mechanical connection between such arm and the base 61. The automatic assembly machine positions the tweezers over a component which is to be picked up and placed on a circuit board. The actuator 73 is activated, causing the gripper extremities 75 and 77 to approach each other along the first transverse axis 85. The inflexible drive belt 71 and the absence of any pivotal or roller bearings insure that the extremities 75 and 77 remain perfectly parallel with each other and that neither is closer to the projecting axis 95 than the other at any time. By approaching the projecting axis 95 at precisely the same rate, the extremities 75 and 77 of the tweezer legs 63 and 65 urge the component along the transverse axis 85 toward the projecting axis 95 and center the component precisely on the projecting axis 95.

Then the actuator 73 is reversed, retracting the extremities 75 and 77 from the component, and the actuator 117 is activated, causing the extremities 101 and 103 of the legs 97 and 99 to center the component on the projecting axis 95 along the second transverse axis 113. Next, both actuators 73 and 117 are activated, causing the four gripper extremities 75, 77, 101 and 103 to converge on and grip the component on four sides. The tool can then be lifted, rotated and laterally shifted to position the component directly above a desired location on a printed circuit board.

The chuck 119 is then extended from the base 61 toward the component along the projecting axis 95 until it contacts the component. Vacuum acting through the openings 123 in the chuck 119 grasps and holds the component. The gripping extremities 75, 77, 101 and 103 are then retracted away from the component and the chuck 119 is further extended to place the component on the printed circuit board without disturbing any nearby components. When the component is in place, the vacuum is released and the chuck is retracted.

From the foregoing it will be appreciated that a linear tweezers according to the invention can be utilized to position a component or other workpiece with great precision on a printed circuit board or other subassembly being fabricated. The tweezers can be adapted for components of any desired shape by changing gripping tools. The tweezers can easily be detached from any movable arm or other carriage for maintenance and replacement. The tweezers are linearly activated and move linearly, assuring true parallel motion of the gripping extremities without any mechanical looseness or other disadvantages inherent in pivotal and roller induced motion. The direct, positive, linearly-acting linkage between the legs assures precision in centering the component.

Although a specific embodiment of the invention has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

I claim:

1. A linear tweezers comprising:
   a base;
   a first pair of tweezer legs, each leg having a gripper extremity and a guide segment laterally offset with respect to the gripper extremity;
   first guide means in fixed relation to the base and defining a single linear guide channel parallel with and laterally offset with respect to a first transverse axis for slidingly receiving the guide segments of both the legs and constraining any movement of the guide segments to sliding linear movement through the channel whereby the gripper extremities are constrained to move only along said first transverse axis;
   a linearly-acting linkage laterally offset with respect to the first transverse axis, connecting the legs, responsive to any movement of either gripper extremity through a distance in either direction along the axis to cause the other gripper extremity to move an equal distance in the opposite direction;
   first actuating means carried by the base and laterally offset with respect to the first transverse axis, operative to cause one gripper extremity to move toward the other and thereby to urge the gripper extremities against opposite surfaces of a workpiece located therebetween to center the workpiece along the transverse axis on a projecting axis which extends from the base perpendicular to the transverse axis and to grip the workpiece;
   a second pair of tweezer legs, each leg having a gripper extremity and a guide segment laterally offset with respect to the gripper extremity;
   second guide means in fixed relation to the base and defining a second single linear guide channel parallel with and laterally offset with respect to a second transverse axis, the second axis generally perpendicular to the first transverse axis and to the projecting axis, for slidingly receiving the guide segments of both of the second pair of legs and constraining any movement of said guide segments to sliding linear movement through the second channel whereby the gripper extremities thereof are constrained to move only along said second transverse axis;
   a second linearly-acting linkage laterally offset with respect to the second transverse axis, connecting the legs of the second pair, responsive to any movement of either gripper extremity through a distance in either direction along the second transverse axis to cause the other gripper extremity to move an equal distance in the opposite direction; and
   second actuating means carried by the base and laterally offset with respect to the second transverse axis, operative to cause one gripper extremity of the second pair to move toward the other and thereby to urge the gripper extremities against opposite surfaces of the workpiece to center the workpiece along the second transverse axis on the projecting axis and to grip the workpiece.

2. A linear tweezers according to claim 1 wherein the first and second actuating means are operable sequentially to center the workpiece along first one and then the other of the transverse axes and simultaneously to grip the workpiece on four sides.

3. A linear tweezers according to claim 1 wherein the legs, the guide means, the linkages and the actuating means are spaced apart from the projecting axis and wherein the base includes means on the projecting axis for receiving a chuck whereby the chuck can be moved along the projecting axis to grasp the workpiece after the workpiece has been centered.

4. A linear tweezers according to claim 3 and further comprising a chuck operative to grasp the workpiece after it has been centered and to carry it along the projecting axis.

5. A linear tweezers comprising:
   a base;
   a first pair of tweezer legs, each leg having a transverse gripper segment with a gripper extremity, a transverse guide segment laterally offset with respect to the gripper extremity, and a support segment therebetween;
   first guide means in fixed relation to the base and defining a single linear first guide channel parallel with and laterally offset with respect to a first transverse axis for slidingly receiving the guide segments of both of the first pair of legs and constraining any movement of the guide segments to sliding linear movement through the channel whereby the gripper extremities are constrained to move only along said first transverse axis;
   a first pair of pulleys carried by the base and defining a first drive belt loop path parallel with and laterally offset with respect to the first transverse axis;

an inelastic, flexible drive belt looped around the pulleys to define a first endless loop having proximal and distal portions generally parallel with and laterally offset with respect to the transverse axis;

means connecting one of the legs to the proximal portion of the loop and the other leg to the distal portion of the loop whereby any movement of either leg through a distance in either direction through the channel is transmitted through the drive belt to the other leg, causing the other leg to move an equal distance in the opposite direction;

first actuating means carried by the base and laterally offset with respect to the first transverse axis, operative to cause one leg to move toward the other and thereby to urge the gripper extremities against opposite surfaces of a workpiece located therebetween to center the workpiece along the transverse axis on a projecting axis which extends from the base perpendicular to the transverse axis and to grip the workpiece;

a second pair of tweezer legs, each leg having a transverse gripper segment with a gripper extremity, a transverse guide segment laterally offset with respect to the gripper extremity, and a support segment therebetween;

second guide means in fixed relation to the base and defining a second single linear guide channel parallel with and laterally offset with respect to a second transverse axis, the second axis generally perpendicular to the first transverse axis and to the projecting axis, for slidingly receiving the guide segments of both of the second pair of legs and constraining any movement of the guide segments to sliding linear movement through the second channel whereby the gripper extremities thereof are constrained to move only along said second transverse axis;

a second pair of pulleys carried by the base and defining a second drive belt loop path parallel with and laterally offset with respect to the second transverse axis;

a second inelastic, flexible drive belt looped around the pulleys to define a second endless loop having proximal and distal portions generally parallel with and laterally offset with respect to the second transverse axis;

means connecting one leg of the second pair of the proximal portion of the second loop and the other leg to the distal portion of the loop whereby any movement of either leg through a distance in either direction through the second channel is transmitted through the drive belt to the other leg, causing the other leg to move an equal distance in the opposite direction; and second actuating means carried by the base and laterally offset with respect to the second transverse axis, operative to cause one leg of the second pair to move toward the other and thereby to urge the gripper extremities against opposite surfaces of the workpiece to center the workpiece along the second transverse axis on the projecting axis and to grip the workpiece.

6. A linear tweezers according to claim 5 wherein the first and second actuating means are operable sequentially to center the workpiece along first one and then the other of the transverse axes and simultaneously to grip the workpiece on four sides.

7. A linear tweezers according to claim 5 wherein the legs, the guide means, the pulleys, the drive belts, the connecting means and the actuating means are spaced apart from the projecting axis and wherein the base includes means on the projecting axis for receiving a chuck whereby the chuck can be moved along the projecting axis to grasp the workpiece after the workpiece has been centered.

8. A linear tweezers according to claim 7 and further comprising a chuck operative to grasp the workpiece after it has been centered and to carry it along the projecting axis.

* * * * *